(12) United States Patent
Tanioka et al.

(10) Patent No.: US 6,906,546 B2
(45) Date of Patent: Jun. 14, 2005

(54) SEMICONDUCTOR DEVICE INSPECTION APPARATUS AND INSPECTION METHOD

(75) Inventors: Michinobu Tanioka, Tokyo (JP); Toshinobu Ogatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/695,388

(22) Filed: Oct. 29, 2003

(65) Prior Publication Data

US 2004/0100297 A1 May 27, 2004

(30) Foreign Application Priority Data

Oct. 29, 2002 (JP) ........................................ 2002-315084

(51) Int. Cl.[7] .............................................. G01R 31/26
(52) U.S. Cl. ...................................... 324/765; 324/758
(58) Field of Search ............................... 324/754–758, 324/760–762, 765, 158.1

(56) References Cited

U.S. PATENT DOCUMENTS

| | | | | |
|---|---|---|---|---|
| 4,864,227 A | * | 9/1989 | Sato | 324/758 |
| 4,929,893 A | * | 5/1990 | Sato et al. | 324/758 |
| 5,410,259 A | * | 4/1995 | Fujihara et al. | 324/758 |
| 5,436,571 A | * | 7/1995 | Karasawa | 324/765 |
| 5,828,225 A | * | 10/1998 | Obikane et al. | 324/758 |

FOREIGN PATENT DOCUMENTS

| | | |
|---|---|---|
| JP | 9-330960 | 12/1997 |
| JP | 2000-26082 | 1/2000 |

* cited by examiner

Primary Examiner—Minh N. Tang
(74) Attorney, Agent, or Firm—Young & Thompson (57) ABSTRACT

Semiconductor device inspection apparatus suitable for inspecting narrow-pitched semiconductor devices and an inspection method. The apparatus has a wafer stage, a base table, an X stage, a Y stage, an elevation unit mounted on the Y stage and elevates the wafer stage up and down, a rotary unit which turns the wafer stage, a vibration elimination table which reduces vibration of the base table, a probe card having plural probe needles which electrically contact plural electrodes when the wafer stage moves upward, and a probe card holder where the probe card is to be placed. The heights of needles of the probe card are detected by a laser displacement meter. Images of a wafer and the needles are sensed by a camera. Based on image information, positions of the wafer and probe card are computed and the X stage, Y stage and elevation unit are controlled.

12 Claims, 6 Drawing Sheets

SEMICONDUCTOR DEVICE INSPECTION APPARATUS AND INSPECTION METHOD

BACKGROUND OF THE INVENTION

1. Field of the Invention

The present invention relates to a semiconductor device inspection apparatus and inspection method which inspect an LSI (Large Scale Integration) as a semiconductor device or a bare LSI (bare chip), and, more particularly, to a semiconductor device inspection apparatus and inspection method which are suitable for inspection of an LSI, a bare chip and a wafer which have narrow electrode pitches.

2. Description of the Related Art

Conventionally, a semiconductor device is inspected by acquiring electric contact between the semiconductor device as an inspection target and an inspection substrate by letting probes contact the external terminals of the semiconductor device. An inspection apparatus is available on the market under the name of a wafer prober. An inspection apparatus which deals with adjustment of the parallelism and the influence of vibration at the time of operating the XY stage, which are the issues of the former conventional inspection apparatus to be cleared, is described in Japanese Patent Laid-Open No. 330960/1997 (Patent Document 1). An inspection stage and an inspection apparatus which overcomes the unstable contact caused by tilting of an inspection-target mount table when a semiconductor device to be inspected whose pin quantity is increased is described in Japanese Patent Laid-Open No. 2000-26082 (Patent Document 2). The specifications of a prober available from a prober maker is given in Accretech Product Catalog UF200S (Non-patent Document 1). Those prior arts will be discussed below.

(1) Inspection Apparatus Described in Japanese Patent Laid-Open No. 330960/1997 (Patent Document 1)

Patent Document 1 describes an inspection apparatus which detects the parallelism of a test head and an inspection-target mount table and adjusts the parallelism to acquire stable contact between probe needles and the electrodes of the inspection target and eliminates the influence of positional misalignment by eliminating the influence of vibration at the time of executing step feeding.

(2) Inspection Stage and Inspection Apparatus Described in Japanese Patent Laid-Open No. 2000-26082 (Patent Document 2)

Patent Document 2 describes an inspection stage and inspection apparatus which provide an elevation unit for a inspection target with a mechanism for controlling the elevation position and means for detecting the parallelism so that the tilting of an inspection-target mount table caused when the number of pins of a probe card is increased can be detected and corrected, thus making it possible to always keep the inspection-target mount table horizontal.

(3) Prober Described in Accretech Product Catalog UF200S (Non-patent Document 1)

This document is the catalog of a currently available prober or an inspection apparatus for an IC chip formed on a wafer and describes that the adequate wafer size is 5 to 8 inches and the general precision is within 4 $\mu$m.

With regard to the LSI mounting technology, at present, people are paying attention to, and making great efforts on, the development of the mounting technology of the third generation and turning it into products, as typified by stacked CSP (Chip Size Package) or the like. To realize higher integration and faster transfer, it will become necessary in the near future to make a breakthrough on bare chips based on the third generation mounting technology. According to the JEITA 2001 mounting technology road map, the then expected electrode pitch will be reduced to 20 $\mu$m by the year 2010. To make practical use of the LSI mounting technology of devices having such super fine electrodes of 30 $\mu$m or less, it is extremely important to inspect devices and sort out good devices at the stage of a wafer or bare chips. To achieve it, an inspection apparatus should be guaranteed with the precision of 1 $\mu$m or less. As the achievement involves the development of fine probes, it requires an inspection apparatus which can both measure the basic characteristics of probe needles and the originally intended wafer inspection. From the above viewpoints, the prior arts bring about the following problems.

The inspection apparatus described in Japanese Patent Laid-Open No. 330960/1997 or the first prior art is so designed as to be moved and positioned with respect to the XYZ and θ directions at the time of inspection and be moved mainly in the Y direction step by step by each IC chip to make the electrode pads of each IC chip electrically contact the probe needles and inspect IC chips one by one, as mentioned in paragraph 0013 of the specification discussing one embodiment. The contact to the first IC chip is made by picking up the images of the probe needles and the inspection apparatus or the inspection target by means of a camera, computing their positions from the picked-up images and making corrections. Thereafter, contact marks are observed with the camera and X- and Y-directional offset values are input to make the contact to the center of each electrode of the inspection target. Then, the IC chips on the entire wafer are probed and inspected through a constant step feeding operation.

This inspection apparatus has the following shortcomings.

(1) As step feeding is carried out with the first positioned chip in a lot taken as a reference, the positional precision for the subsequent IC chips is determined by the initial θ-directional error and the stage precision in the feeding direction. Accordingly, the precision of an IC chip distant from the first chip becomes lower, making it difficult to probe electrodes of a fine pitch of 40 $\mu$m or less.

(2) As the elevation unit for the Z axis uses a stepping motor using a ball screw, upward movement by a given amount is merely designed, making the actual amount of stage movement unclear, and the precision is as large as several micrometers. This does not guarantee the adequate overdrive amount (which is the pressing amount after the probe needles contact the electrodes of the inspection target and will be hereinafter referred to as "OD amount"), which may adversely affect the contactability.

(3) Because the inspection apparatus does not have a load detecting mechanism, a contact start point cannot be defined clearly, making it hard to measure the basic characteristics of the probe needles.

(4) As the elevation unit does not have a stopper mechanism, the probe card should be provided with a stopper.

(5) In case where a semiconductor device abuts on the stopper of the probe card and stops, the semiconductor device may be damaged.

The inspection apparatus described in Japanese Patent Laid-Open No. 2000-26082 or the second prior art inspects a wafer by repeating index feeding of the wafer after alignment of the wafer with a probe card is performed, as mentioned in paragraph 0020 of the specification discussing the means for solving the problems of the second prior art. As positions in upward and downward movements can be detected by a linear sensor attached to an elevation unit, the problem (2) of the first prior art is overcome. Although the parallelism of a wafer chuck is detectable, the second prior art fails to describe any specific means of detecting the parallelism of the wafer chuck and the probe card. The second prior art therefore still has the problems (1), (3), (4) and (5) of the first prior art.

It is mentioned that the prober described in Accretech Product Catalog UF200S or the third prior art has the general precision of 4 µm or less as the main specification. The third prior art however fails to specifically describe the mechanism portions and operation of the prober and is thus assumed to take the structure of the first prior art or the second prior art. The third prior art therefore also has the problems (1) to (5).

In short, the conventional semiconductor device inspection apparatuses have the problems that positioning is done through constant step feeding after inspection of the first IC chip, there is insufficient consideration given on the environment which influences the precision, such as vibration, there is no contact detecting mechanism, there is no load detecting mechanism, it is difficult to probe fine-pitched electrodes, it is not possible to clearly define a contact start point, making it hard to secure the adequate OD amount in every inspection area, it is difficult to measure the basic characteristics of the probe needles and the elevation mechanism does not have a stopper mechanism.

SUMMARY OF THE INVENTION

Accordingly, it is an object of the invention to provide a semiconductor device inspection apparatus suitable for inspection of narrow-pitched semiconductor devices and an inspection method using the inspection apparatus.

A semiconductor device inspection apparatus according to the present invention acquires electric contact between a semiconductor device and an inspection substrate and comprises a wafer stage on which the semiconductor device as an inspection target is to be placed; a base table; an X stage mounted on the base table and movable in an X direction; a Y stage mounted on the X stage and movable in a Y direction crossing the X direction; an elevation unit which is mounted on the Y stage and elevates the wafer stage up and down; a rotary unit which turns the wafer stage; a vibration elimination table which reduces vibration of the base table; a probe card having a plurality of probe needles which electrically contact a plurality of electrodes when the wafer stage moves upward; a probe card holder in which the probe card is to be placed; a sensor which detects heights of probe needles of the probe card; a camera which picks up images of the inspection target and the probe needles of the probe card; image processing means which performs image processing on the images picked up by the camera; and a control section which computes positions of the inspection target and the probe card based on image information acquired by the image processing means and controls the X stage, the Y stage and the rotary unit based on results of that computation.

In the semiconductor device inspection apparatus, a linear scale for detecting X-directional and Y-directional positions is arranged at center portions of the X stage and the Y stage, centers of the X stage and the Y stage are aligned with a center of an inspection probe and drive motors for the X stage and the Y stage and guide rails for guiding the X stage and the Y stage in the X direction and Y direction are laid out symmetrically with respect to the center of the inspection probe.

In both semiconductor device inspection apparatuses, a linear scale for detecting up and down positions of the wafer stage is provided on the elevation unit for the wafer stage, the elevation unit has a fixed frame which is driven up and down by a stepping motor, a movable frame, crossroller guides which guide the movable frame in such a manner as to be movable up and down with respect to the fixed frame, a cylinder which is fixed to the fixed frame and whose piston rod pushes the movable frame upward, a load sensor which detects a load applied by a contact bar fixed to the movable frame as the contact bar abuts on the load sensor when the movable frame moves upward, and a control section which controls pressing force by the cylinder based on the load detected by the load sensor, and the load sensor restricts upward movement of the contact bar, not downward movement of the contact bar, when the contact bar abuts on the load sensor.

According to the invention, there is provided a method of inspecting a semiconductor device by acquiring electric contact between a semiconductor device and an inspection substrate using an inspection apparatus comprising a wafer stage on which the semiconductor device as an inspection target is to be placed, a base table, an X stage mounted on the base table and movable in an X direction, a Y stage mounted on the X stage and movable in a Y direction crossing the X direction, an elevation unit which is mounted on the Y stage and elevates the wafer stage up and down, a rotary unit which turns the wafer stage, a vibration elimination table which reduces vibration of the base table, a probe card having a plurality of probe needles which electrically contact a plurality of electrodes when the wafer stage moves upward, a probe card holder in which the probe card is to be placed, a sensor which detects heights of probe needles of the probe card, a camera which picks up images of the inspection target and the probe needles of the probe card, image processing means which performs image processing on the images picked up by the camera, and a control section which computes positions of the inspection target and the probe card based on image information acquired by the image processing means and controls the X stage, the Y stage and the rotary unit based on results of that computation. The method comprises the steps of placing the inspection target on the wafer stage; placing the probe card in the probe card holder; picking up images of the inspection target and the probe needles of the probe card by the camera; computing positions of the images and then moving the X stage, the Y stage and a θ stage in such a way that positions of the electrodes of the inspection target are aligned with positions of the probe needles, moving the elevation unit up to a position where the probe needles come in contact with the inspection target and then moving the elevation unit by a predetermined amount from that position of contact; energizing the inspection target in that state and inspecting the inspection target; moving the elevation unit down to a focal position of the camera for picking up the image of the inspection target; moving the X stage and the Y stage to a position of a next inspection target from that moved-down position; and repeating all the steps up to the step of moving the elevation unit down until inspection of all inspection targets is finished.

DETAILED DESCRIPTION OF THE PREFERRED EMBODIMENTS

Figure 1:
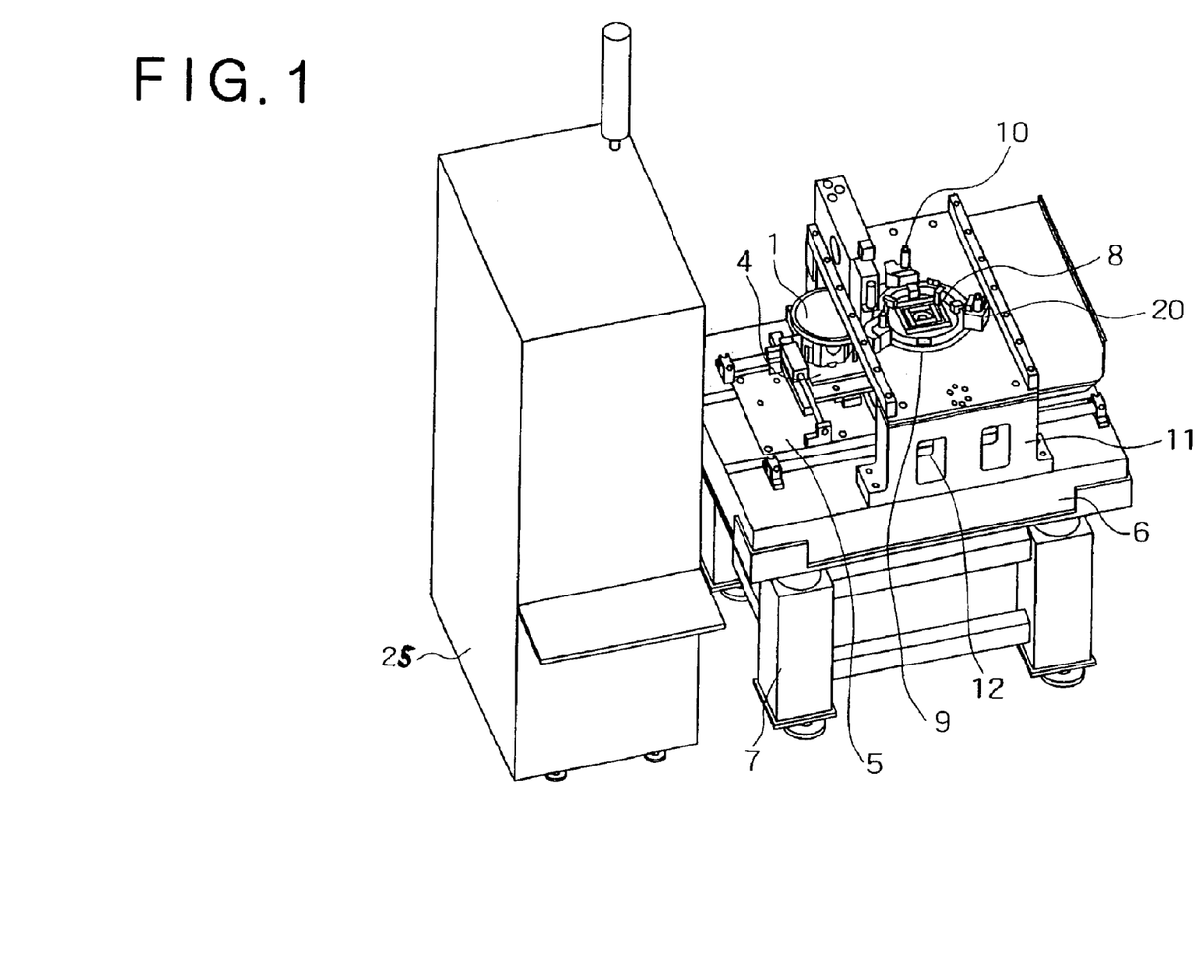
FIG. 1 is a perspective view illustrating the general structure of an inspection apparatus according to one embodiment of the present invention.
Figure 2:
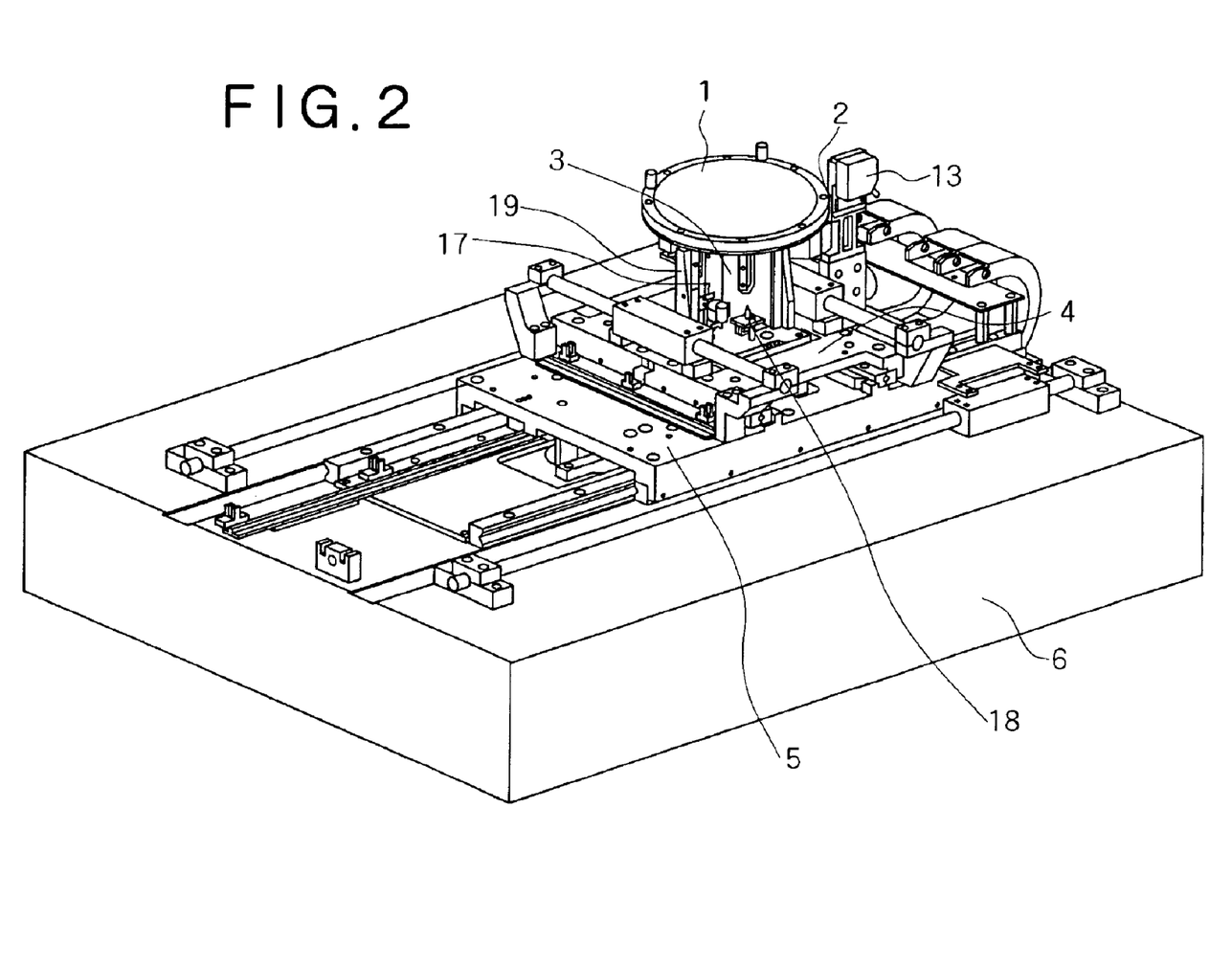
FIG. 2 is a perspective view showing XYZθ mechanism portions of the inspection apparatus according to the embodiment of the invention.
Figure 3:
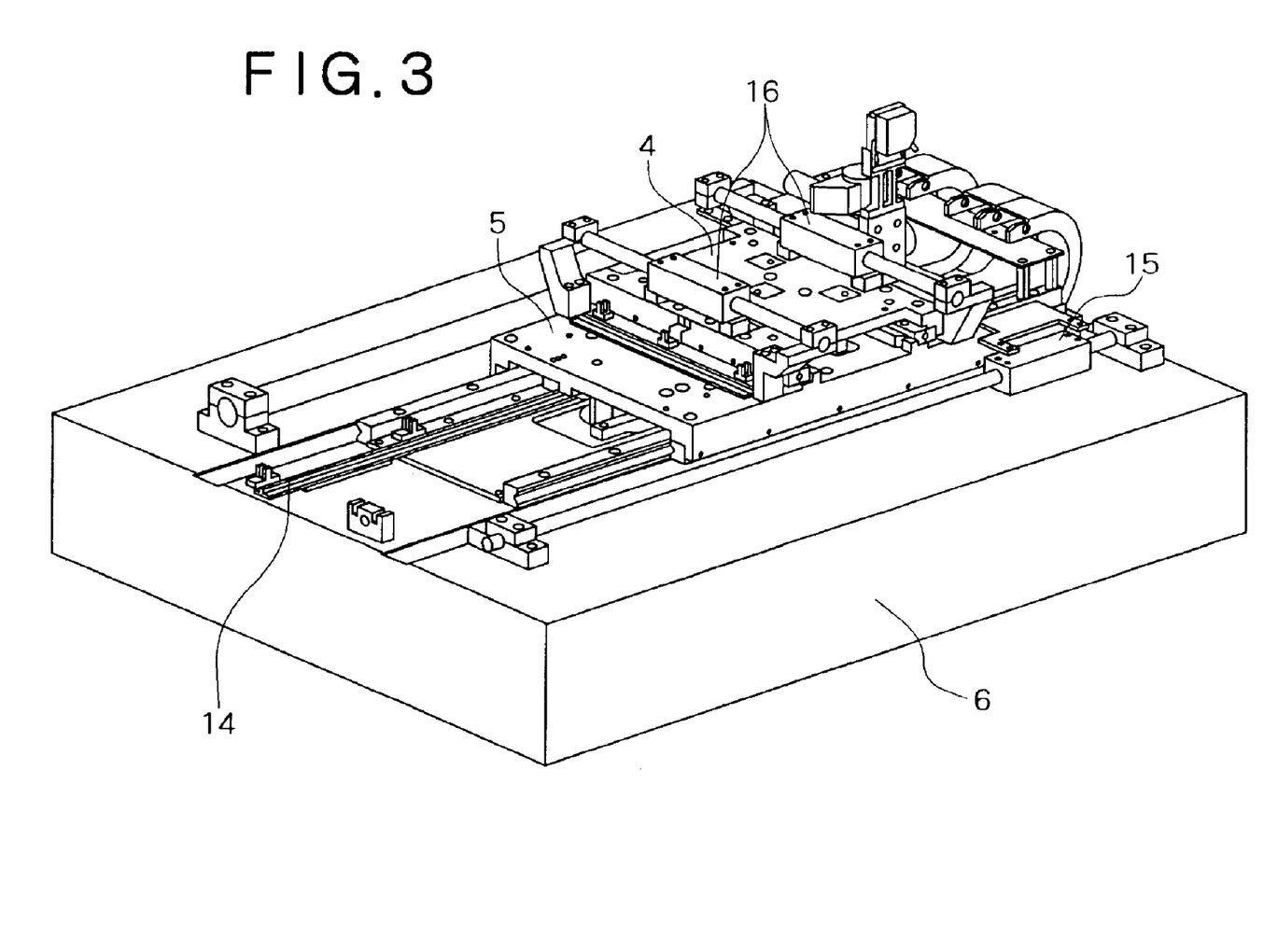
FIG. 3 is a perspective view showing an X stage portion and Y stage portion of the inspection apparatus according to the embodiment of the invention.
Figure 4:
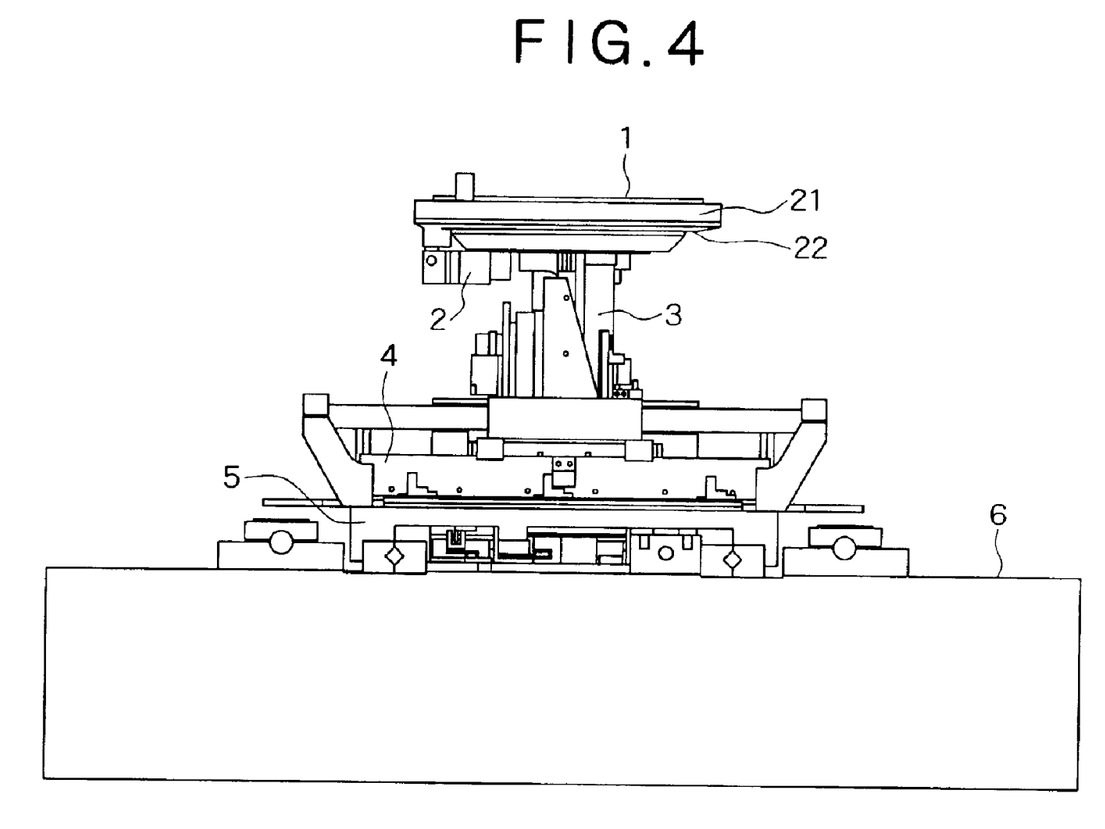
FIG. 4 is a side view showing the XYZθ mechanism portions of the inspection apparatus according to the embodiment of the invention.

A preferred embodiment of the present invention will now be described with reference to the accompanying drawings. FIG. 1 is a perspective view illustrating the general structure of an inspection apparatus according to the first embodiment of the invention, FIG. 2 is a perspective view showing an XYZθ stage extracted, FIG. 3 is a perspective view showing an XY mechanism portion extracted, and FIG. 4 is a side view showing an XYZ mechanism portion extracted. In this embodiment, XYZ is the three-dimensional orthogonal coordinate system.

As shown in FIGS. 1 and 2, the semiconductor device inspection apparatus according to the embodiment of the invention has a base table 6 mounted on a vibration elimination table 7 placed on the floor and an X stage 5 movable in the X direction (a horizontal direction) is mounted on the base table 6. An Y stage 4 movable in the Y direction (a horizontal direction perpendicular to the X direction) is mounted on the X stage 5. An elevation unit 3 is supported on the Y stage 4 and a wafer stage 1 is placed rotatably on the elevation unit 3. The wafer stage 1 is turned by a rotary unit 2. A heater 21 which heats a semiconductor device on the wafer stage 1 is assembled into the wafer stage 1, and a cooling jacket 22 of a water cooling type or the like is provided so as not to transmit the heat from the heater 21 to the elevation unit 3.

Bridge leg portions 11 are provided on the base table 6 across the wafer stage 1. Mounted on the bridge leg portions 11 is a wafer camera 10 which picks up the images of a probe card holder 9 where a probe card 8 is placed and a semiconductor device as an inspection target. Wafer camera 10 has an image processing means that performs image processing on the images picked up by the wafer camera 10. A probe camera 12 which picks up the images of probe needles is mounted on the Y stage 4. A control section 25 computes positions of the inspection target and the probe card based on image information acquired by the image processing means and controls the X stage 5, the Y stage 4 and the rotary unit 2 based on results of that computation. The above illustrates the general structure of the inspection apparatus.

Individual components of the inspection apparatus will be discussed next. FIG. 3 shows the portions of the X stage 5 and the Y stage 4 in detail. A linear scale 14 of high resolution which is used in feedback control is arranged in the moving direction of the X stage 5 or in parallel to the X direction. The read head of the linear scale 14 is directly attached to the base table 6 made of granite. A pair of motors 15 and a pair of guides are arranged evenly with respect to the front-to-rear center of the X stage 5. The front-to-rear center of the X stage 5 is the center of probing, and as the linear scale and the read head are arranged directly under probing and the motors as drive sources are arranged evenly, the influence of the thermal expansion of the individual components is suppressed, thereby restraining the deformation of the stage with respect to the moment load, such as pitching or yawing, as much as possible. Further, the thermal expansion coefficients of the base table 6, the cameras 10 and 12 and the probe card holder 9 are set identical, the stability with respect to a change in temperature is improved. Large, high-precision crossroller guides are used as the guides that are important in securing the operational precision of the stage and are attached directly to the base table 6. To meet a demand for high precision, an air bearing system called air slide is often selected because of its low slide resistance and linearity easily ensured. Because an eccentric load corresponding to an 8-inch wafer is applied, a high mechanical rigidity is demanded, and the air slide that matches the mechanical rigidity becomes large and expensive, however, crossroller type linear guiding is selected in the embodiment. As the parallelism of the base table 6 is finished to 1 μm or so and the crossroller guides are attached directly to the finished surface, the strength with respect to vibration, eccentric load or the like is increased. Further, the height from the base table 6 to the top surface of the stage can be suppressed to about 80 mm, in which point the structure is advantageous with respect to thermal deformation, pitching, yawing and so forth. Taking those measures, it is sufficiently possible to position the XY stage according to the embodiment at the level of 0.01 μm. Further, as the guide portion, unlike the air slide, has the adequate viscoelasticity, it is possible to make the stage still on the nm order of the linear scale resolution or lower. For the Y stage 4, like the X stage 5, a linear scale is arranged directly under the center of probing and linear motors 16 and guides are arranged evenly.

Referring now to FIGS. 2 and 4, the elevation unit 3 will be discussed. A pressure cylinder 17 and a load sensor 18 as load detecting means are attached to the elevation unit 3 for the wafer stage 1. The air pressuring portion of the pressure cylinder 17 is supplied beforehand with air equivalent to the sum of the weight of the wafer stage 1, the maximum load needed at the time the probe contacts a wafer on the wafer stage 1 and the resistive force, such as the slide resistance, of the guide portion of the elevation unit 3. The load sensor 18 receives a load of the sum of the maximum load needed for contact and pre-pressure. As the elevation unit 3 moves upward and the probe needles contact the electrodes of the inspection target, the amount of a change in load can be measured as a load received by the stage. When the load exceeds the sum of the pre-pressure and the maximum load needed for contact, the wafer stage 1 is completely cut off from the load sensor 18, the elevation unit 3 has a stopper function for protection of the probe and the inspection target. While the drive system uses a stepping motor, the linear scale is attached to the portion that is directly coupled to the stage and positional feedback is executed, a high positional precision can be acquired. As the wafer stage 1 can mount an 8-inch wafer, the crossroller guides 19 are provided on both sides to secure the rigidity of the stage. This prevents the stage from tilting even at the time of inspecting an IC chip located at the end of the stage.

Specifically, the elevation unit 3 has a fixed frame which is driven up and down by a stepping motor 13 and a movable frame, both frames being guided by the crossroller guides 19 in such a manner as to be movable up and down with respect to the fixed frame. A cylinder is fixed to the fixed frame and its piston rod pushes the movable frame upward. As the contact bar fixed to the movable frame abuts on the load sensor 18 when the movable frame moves upward, the load sensor 18 detects a load applied by the contact bar. A control section controls pressing force by the cylinder based on the load detected by the load sensor 18. The load sensor 18 restricts upward movement of the contact bar, not downward movement of the contact bar, when the contact bar abuts on the load sensor 18. For example, the load sensor 18 is a load cell provided with its load detecting direction facing downward so that as the contact bar of the movable frame to which upward pressing force is applied abuts on the load cell, the pressing force is detected by the load cell, and when the movable frame moves downward, the contact bar moves away from the load sensor 18 so that the downward movement of the contact bar and thus the downward movement of the movable frame are not restricted. In case where, for example, the weight of the portion supported by the cylinder, including the wafer stage 1 and the movable frame, is 52 N, therefore, if the cylinder-originated thrust force (the pressing force of the piston rod to press the wafer stage 1 and the movable frame or the like upward) is adjusted to, for example, 52.5 N, upward force of 0.5 N is applied to the movable frame and the contact bar abuts on the load sensor 18 with the force of 0.5 N. Under this situation, the movable frame and the wafer stage 1 stop and become stable with respect to the fixed frame. If the fixed frame is moved upward by the stepping motor, the probe card 8 contacts a wafer on the wafer stage 1 and the force of over 0.5 N is applied to the wafer from the probe card 8, the contact bar moves away from the load sensor 18 and the movable frame escapes downward relatively to the fixed frame moving upward. As a result, the movable frame and thus the wafer stage 1 stop and no force of over 0.5 N acts on the wafer.

The bridge leg portions 11 on which the base table 6, the wafer camera 10 and the probe card holder 9 are mounted are made of a natural stone, such as granite. Such a natural stone is a high-vibration attenuating material which has low thermal expansion and attenuates vibration. This structure provides size stability and vibration controllability of the wafer camera 10 and probe card holder 9 mounted on the bridge leg portions 11. Further, the provision of the vibration elimination table 7 between the base table 6 and the floor cuts off the mechanism portions from the ground and eliminates the influence of vibration from external environment.

It is possible to attach a camera 20, mounted on the XY stage that can be fed by a small step, to the mount table for the probe card holder 9 and observe the contact state of the electrodes of the inspection target with the probe via a through hole or glass provided in the center portion of the probe card 8 (e.g., a finger read type probe card whose portions corresponding to the probe needles are formed on a polyimide sheet by photolithography or a finger read type probe card whose probe needles are formed by electroforming with glass ceramics as the base material). The provision of the camera 20 and the through hole formed in the probe can ensure reliable visual grasping of the contact state. In case of extremely small electrode pitches of 30 µm or less, particularly, those measures, used together with the scheme of electrically checking the positional relationship between the probe and the electrodes, can significantly shorten the checking work at the time of mounting a novel probe developed or at the time of replacing the probe card with a new one.

That portion of the wafer stage 1 which can supply air to the back of the wafer mounting side is separated to three parts each of which is provided with a valve for supplying air. As the valve is opened or closed, the size of the inspection target can be changed arbitrarily, from the chip size of 5 to 20 mm to the size of an 8-inch wafer. As a porous plate is used for the inspection-target mounting surface of the wafer stage 1, an inspection target does not have cracks formed therein and can be fixed reliably even if the inspection target becomes thinner.

Figure 5:
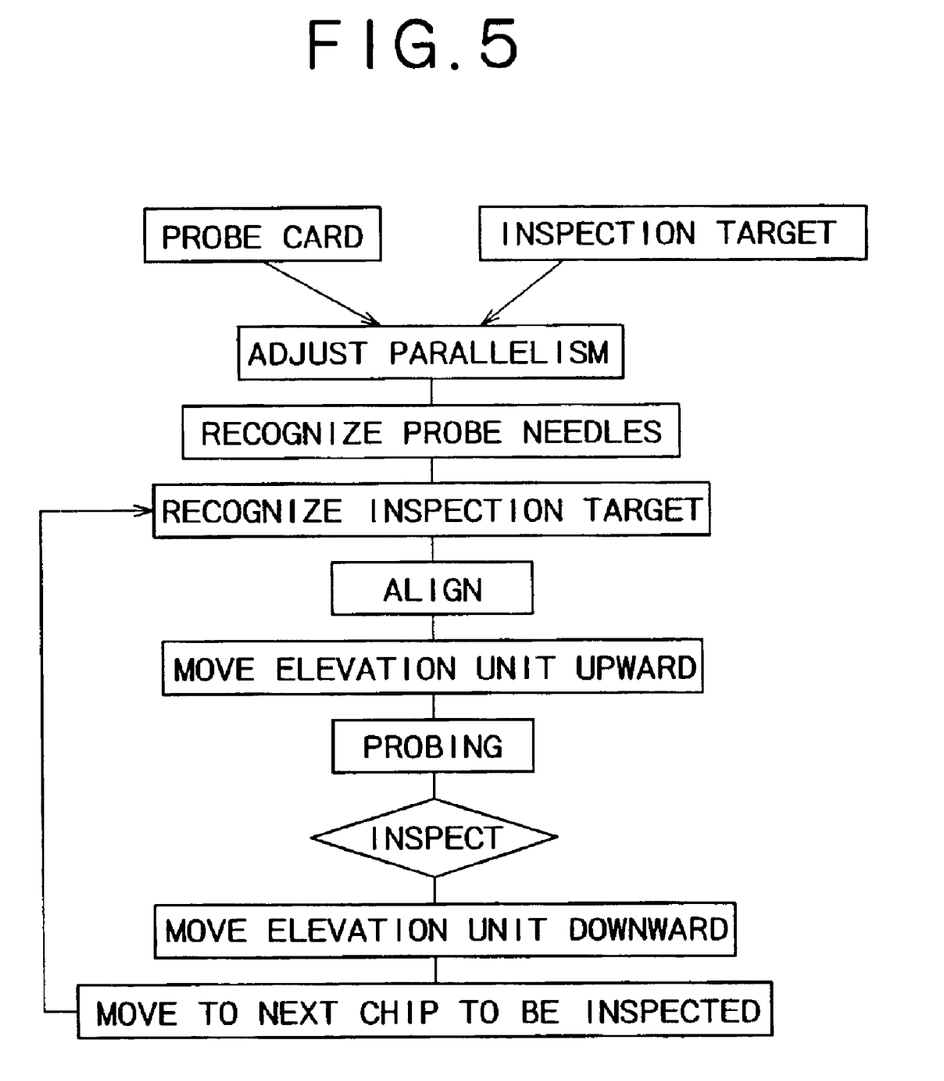
FIG. 5 is a flowchart illustrating an inspection method which uses the inspection apparatus according to the embodiment of the invention.

A description will now be given of an inspection method for a semiconductor device in case of using the inspection apparatus according to the embodiment of the invention by referring to FIG. 5 together with the operational flow of the apparatus.

First, a probe card 8 is placed in the probe card holder 9, and adjustment of the parallelism of the probe card 8 with respect to the wafer stage 1 is performed. For example, the adjustment is carried out by measuring the heights of all the pins of the probe by a laser displacement meter attached to the XY stage and computing the parallelism. Based on the results, the height of the probe card 8 is corrected. Another scheme is to compute the inclination from the image provided by a probe-needle identifying camera and make correction. The correction is carried out using micrometers at the three locations which are provided on the probe card holder 9 and operate in up and down directions and a micrometer which operates in the θ direction.

After adjustment of the parallelism, the probe needles are recognized. In consideration of the precision of image recognition, it is preferable that the recognition points be eight points per IC chip, one on each of the right and left ends of each side, or four points per IC chip, one on each side.

A semiconductor device as an inspection target is placed on the wafer stage 1 and the images of the external electrodes of an arbitrary IC chip of the inspection target are picked up by the wafer camera 10. The recognition points for the inspection target are the same as those for the probe needles.

To meet the rapid high integration of LSI mounting, recently, semiconductor devices in each of which flip-chip mounting bumps (metal projections) for connecting a bare chip directly to a circuit board are formed on the electrode portion are increasing rapidly. In case of inspecting such a semiconductor device, it is essential to probe the bumps. In consideration of this point, the present inspection apparatus employs a position recognition scheme that performs recognition in two stages, recognizing the IC chip electrodes and then recognizing the bumps, thereby improving the precision.

First, the electrodes of the semiconductor device are recognized and then the positions of the bumps are recognized. After recognition of all the points, the wafer stage 1 is turned for positional alignment in the θ direction. Then, the bump positions of the inspection target are recognized again and the position of the wafer stage 1 is corrected for alignment in the X and Y directions.

At this time, the X stage 5 and the Y stage 4 are moved until the positions of the probe needles and the bumps of the inspection target are positioned to the center positions of their respective cameras with the specified precision, and the positions upon completion of positioning are computed from the value of the linear scale 14. This can ensure high-precision positional detection without being affected by an error originated from the deformation of the cameras and lenses. After positioning of the probe needles and the electrodes of the inspection target is completed, the wafer stage 1 is moved under the probe needles, the elevation unit 3 is moved upward to make the probe needles contact the electrodes of the inspection target and electric checks, such as OS (Open Sort), DC (Direct Current) and FT (Function Test), are carried out. After the inspection is finished, the elevation unit 3 is moved downward, the stages are moved to the next chip to be inspected, then inspection is executed in the same flow starting from the step of positional recognition for the inspection target. After every chip on a single wafer is finished, the semiconductor devices or inspection targets are removed, which completes the whole inspection process.

In this sequential inspection method, the probing step acquires data by measuring the basic characteristics of the probe needles and performs probing profiling based on the data.

Figure 6:
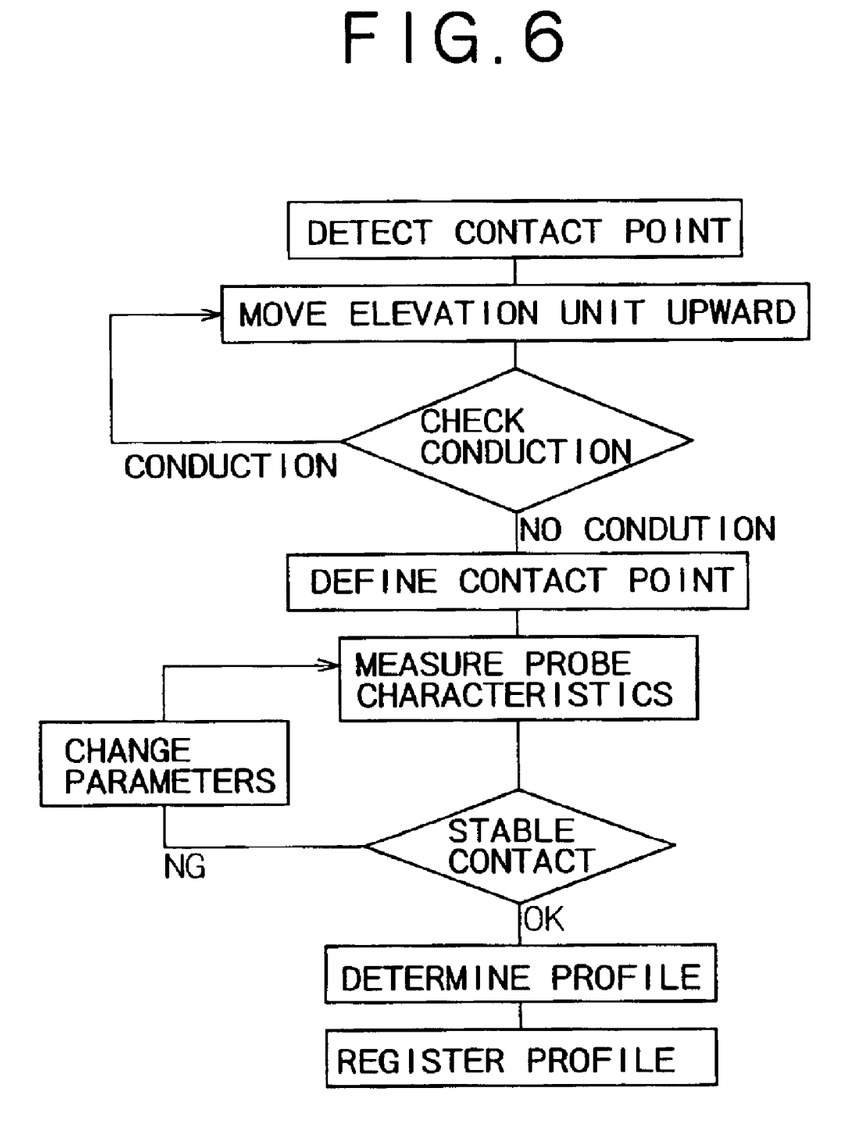
FIG. 6 is a flowchart illustrating a method of measuring the basic characteristics using the inspection apparatus according to the embodiment of the invention.

The scheme of measuring the basic characteristics of the probe will be discussed in detail below referring to FIG. 6. After positional alignment of the inspection target with the probe needles, the elevation unit 3 is moved upward and contacts of the probe needles with the electrodes of the inspection target are detected. The following will discuss the setting of load detection and the operation in the contact detecting step. The contact detecting scheme employs detection by load detecting means.

As the elevation unit 3 has elevation unit guides, slide resistance (static friction and dynamic friction) is generated, so that the load to be detected changes in accordance with the acceleration. It is therefore necessary to set the contact detection in consideration of such a phenomenon. In making this setting, the amount of displacement (point) and the load value by which the static friction was changed to the dynamic friction and the upward stage movement started with hardly any influence on the load detecting means were clarified by studying the relationship between the displacement and the load when the elevation unit 3 was moved upward and checking the reproducibility. There are empirical results showing that in the speed range of 0 to 50 $\mu$m/sec with an upward movement of 100 $\mu$m, for example, the load value becomes almost constant in the area where the amount of upward movement of the elevation unit 3 is 60 $\mu$m or greater and the load value is 10 g for the mean value of +3$\sigma$. Based on the results, reliable contact detection can be achieved under the conditions that the contact detection load is set to 12 g in the first probing and the load detecting means is reset when the point is distant by 60 $\mu$m or greater from the distal end of the probe.

Next, the elevation unit 3 is moved downward by a predetermined amount (e.g., 1-$\mu$m step) to define the contact point and open short inspection is carried out and the point that has become open is defined as the contact start point. The elevation unit 3 is moved gradually from this point and the characteristics of the OD amount and contact resistance and the OD amount and the contact load with respect to the probe needles are measured. In acquiring this data, the adequate conditions under which the contact resistance becomes stable and the contact load becomes ½ of the start point of plastic deformation of the probe needles or less are found out. The adequate conditions are determined based on parameters of the profile of the elevation unit 3 (speed, acceleration, etc.) and the contact method (the number of contacts, scrubbing operation of the XY stage or the like after making the contact). Once the profile to stabilize the contact is determined, it is registered in the apparatus.

Because it is possible to clearly define the constant start point, change and register a probing profile as needed, it is possible to grasp the characteristics of a new probe and significantly shorten the process development period such as process checking at the time of replacing a probe, and the stage replacement time.

Another embodiment of the invention will be discussed next. In case of an inspection target which needs energization and inspection at a high temperature, assembling the thin heater 21 directly under the porous plate in the wafer stage 1 can permit such energization and inspection at up to 100° C. Further, controlling the temperature of the heater 21 can ensure screening inspection at an arbitrary temperature. Furthermore, if a Peltier element is assembled directly under the porous plate in the wafer stage 1 and is controlled, inspection of a wide temperature range from a low temperature to a high temperature can be performed.

As described in detail above, the invention employs the XY stage structure designed in consideration of the balance, the structure capable of eliminating the influence of vibration, the fixed layout of the image processing camera and setting of the adequate image pickup point and thus has the following advantages.

(1) It is possible to inspect an inspection target having electrodes of extremely fine pitches of 30 $\mu$m or less. Further, the structure that uses the pressure cylinder at the rear portion of the elevation unit and the structure that uses the load detecting means can ensure detection of the contact between the probe needles and inspection target, which has been difficult conventionally.

(2) This can ensure the adequate overdrive in every inspection area so that stable contact and inspection can be achieved.

(3) In case where a load equal to or greater than the maximum contact load from the probe card is applied to the wafer stage, the upward movement of the wafer stage can be stopped, thus preventing both the probe needles and the semiconductor device from being damaged and eliminating the need for the provision of the stopper mechanism on the probe card.

(4) Further, it becomes possible to measure the basic characteristics of the probe needles accurately and inspect a wafer. This can contribute to significantly reducing the development period of the probing process.

What is claimed is:

1. A semiconductor device inspection apparatus for acquiring electric contact between a semiconductor device and an inspection substrate, comprising:

a wafer stage on which said semiconductor device as an inspection target is to be placed;

a base table;

an X stage mounted on said base table and movable in an X direction;

a Y stage mounted on said X stage and movable in a Y direction crossing said x direction;

an elevation unit which is mounted on said Y stage and elevates said wafer stage up and down;

a rotary unit which turns said wafer stage;

a vibration elimination table which reduces vibration of said base table;

a probe card having a plurality of probe needles which electrically contact a plurality of electrodes when said wafer stage moves upward;

a probe card holder in which said probe card is to be placed;

a sensor which detects heights of said probe needles of said probe card;

a camera having image processing means picks up images of said inspection target and said probe needles of said probe card and performs image processing on said images; and a control section which computes positions of said inspection target and said probe card based on image information acquired by said image processing means and controls said X stage, said Y stage and said rotary unit based on results of that computation, wherein a linear scale for detecting up and down positions of said wafer stage is provided on said elevation unit for said wafer stage, said elevation unit has a fixed frame which is driven up and down by a stepping motor, a movable frame, crossroller guides which control said movable frame in such manner as to be movable up and down with respect to said fixed frame, a cylinder which is fixed to said fixed frame and whose piston rod pushes said movable frame upward, a load sensor which detects a load applied by a contact bar fixed to said movable frame as a contact bar abuts on said load sensor when said movable frame moves upward, and a control section which controls pressing force by said cylinder based on said load detected by said load sensor, and said load sensor restricts upward movement of said contact bar, not downward movement of said contact bar, when said contact bar abuts on said load sensor.

2. The semiconductor device inspection apparatus according to claim 1, wherein a linear scale for detecting X-directional and Y-directional positions is arranged at center portions of said X stage and said Y stage, centers of said X stage and said Y stage are aligned with a center of an inspection probe and drive motors for said X stage and said Y stage and guide rails for guiding said X stage and said Y stage in said X direction and Y direction are laid out symmetrically with respect to said center of said inspection probe.

3. The semiconductor device inspection apparatus according to claim 1, wherein said camera and said probe card holder are mounted on bridge leg portions mounted on said base table and said base table and said bridge leg portions are made of a natural stone or material with low thermal expansion and a high vibration attenuating property which is comparable to said natural stone.

4. The semiconductor device inspection apparatus according to claim 1, wherein a camera mounted on a stable movable in X, Y and Z directions is placed on a top surface of said probe card holder so as to be able to observe a state of contact between said electrodes of said inspection target and said probe needles of said probe card.

5. The semiconductor device inspection apparatus according to claim 1, wherein a valve is provided on a side surface of said wafer stage and an inspection target varying in size from an individual semiconductor device to a wafer size of a large diameter can be mounted and inspected as a chuck area of said wafer stage is changed by switching said valve.

6. The semiconductor device inspection apparatus according to claim 1, wherein said camera does not have an elevation unit and is fixed.

7. The semiconductor device inspection apparatus according to claim 1, wherein said probe card has a base material whose thermal expansion coefficient is substantially equal to a thermal expansion coefficient of said inspection target, and a heating source and a cooling jacket are buried in a lower portion of said wafer stage so that said inspection target can be inspected at a high temperature and temperature control can be performed.

8. The semiconductor device inspection apparatus according to claim 1, wherein in case where said electrodes of said inspection target are electrodes fabricated in an ordinary semiconductor device fabrication process and further having metal projections formed thereon, images of said metal projections are picked up after picking up images at positions of said electrodes fabricated in said semiconductor device fabrication process, image pickup of said probe needles and said inspection target is carried out at four locations.

9. A method of inspecting a semiconductor device by acquiring electric contact between a semiconductor device and an inspection substrate using an inspection apparatus comprising a wafer stage on which said semiconductor device as an inspection target is to be placed, a base table, an X stage mounted on said base table and movable in an X direction, a Y stage mounted on said X stage and movable in a Y direction crossing said x direction, an elevation unit which is mounted on said Y stage and elevates said wafer stage up and down, a rotary unit which turns said wafer stage, a vibration elimination table which reduces vibration of said base table, a probe card having a plurality of probe needles which electrically contact a plurality of electrodes when said wafer stage moves upward, a probe card holder in which said probe card is to be placed, a sensor which detects heights of said probe needles of said probe card, a camera which picks up images of said inspection target and said probe needles of said probe card, said camera having image processing means which performs image processing on said images picked up by said camera, and a control section which computes positions of said inspection target and said probe card based on image information acquired by said image processing means and controls said X stage, said Y stage and said rotary unit based on results of that computation, said method comprising the steps of:

placing said inspection target on said wafer stage;

placing said probe card in said probe card holder;

picking up images of said inspection target and said probe needles of said probe card by said camera, computing positions of said images and then moving said X stage, said Y stage and a θ stage in such a way that positions of said electrodes of said inspection target are aligned with positions of said probe needles, moving said elevation unit up to a position where said probe needles come in contact with said inspection target and then moving said elevation unit by a predetermined amount from that position of contact;

energizing said inspection target in the position of contact and inspecting said inspection target;

moving said elevation unit down to a focal position of said camera for picking up said image of said inspection target;

moving said X stage and said Y stage to a position of a next inspection target from that moved-down position;

checking electric contact between said probe needles and said inspection target while moving said elevation unit a little after said elevation unit is moved upward to a position where said probe needles come in contact with said inspection target;

detecting a point at which electric contact between said probe needles and said inspection target disappears;

measuring a lift-up amount of said elevation unit and a load and a relationship between said lift-up amount and a contactability while moving said elevation unit up a little with said point taken as a reference;

determining a stable contact area while changing a speed and an acceleration of said elevation unit in that measuring step; registering a probing profile which provides contact stability; and repeating all the steps up to said step of moving said elevation unit down until inspection of all inspection targets is finished.

10. The method according to claim 9, wherein in said step of computing said positions of said images of said inspection target and said probe needles of said probe card by processing said images thereof, said X stage and said Y stage are moved in such a way that said electrodes of said inspection target and said probe needles of said probe card are positioned at a center position of said camera and said positions of said images of said inspection target and said probe needles of said probe card are computed by a linear scale.

11. The method according to claim, wherein said step of detecting electrical contact includes the step of resetting load detecting means to zero when said elevation unit is moved up to a position apart from said probe needles by a predetermined distance, and the step of moving said elevation unit upward at a constant speed until a point of contact from a point at which said load detecting means has been reset to zero.

12. A semiconductor device inspection apparatus for acquiring electric contact between an inspection target and a probe card, comprising:

a wafer stage on which said inspection target is to be placed;

a base table;

an X stage mounted on said base table and movable in an X direction;

a Y stage mounted on said X stage and movable in a Y direction crossing said X direction;

an elevation unit which is mounted on said Y stage and elevates said wafer stage up and down;

a rotary unit which turns said wafer stage;

a vibration elimination table which reduces vibration of said base table;

a probe card having a plurality of probe needles which electrically contact a plurality of electrodes when said wafer stage moves upward;

a camera which picks up images of said inspection target and said probe needles of said probe card; and a control section which computes positions of said inspection target and said probe card based on image information acquired by said camera, said elevation unit comprising:

a movable frame;

a cylinder that pushes said movable frame upward;

a load sensor which detects a load applied by a contact bar fixed to said movable frame as said contact bar abuts said load sensor when said movable frame moves, said load sensor restricts upward movement of said contact bar, when said contact bar abuts said load sensor; and a control section which controls a pressing force exerted by said cylinder based on said load detected by said load sensor.

* * * * *